United States Patent [19]

Nash

[11] Patent Number: 4,484,690

[45] Date of Patent: Nov. 27, 1984

[54] FLAME ARRESTING VENTILATED WALL FOR AN EXPLOSION-PROOF ENCLOSURE

[75] Inventor: James H. Nash, Huntington, W. Va.

[73] Assignee: Service Machine Co., Huntington, W. Va.

[21] Appl. No.: 356,180

[22] Filed: Mar. 8, 1982

[51] Int. Cl.³ .............................................. B65D 25/00
[52] U.S. Cl. ..................................... 220/88 A; 55/444; 55/446; 55/491
[58] Field of Search ............ 110/119; 220/88 R, 88 A; 55/444, 446, 491

[56] References Cited

U.S. PATENT DOCUMENTS

| | | | |
|---|---|---|---|
| 1,902,258 | 3/1933 | Muller | 220/88 A |
| 1,960,259 | 5/1934 | Wyman | 310/88 |
| 2,041,016 | 5/1936 | Pendry | 55/446 |
| 2,068,421 | 1/1937 | Long et al. | 220/88 A |
| 2,151,180 | 3/1939 | Anschicks | 220/88 A |
| 2,160,684 | 5/1939 | Spaeth | 220/88 A |
| 2,220,720 | 11/1940 | Jett | 220/88 A |
| 2,247,225 | 6/1941 | Edwards | 220/88 A |
| 2,388,395 | 11/1945 | Duggan | 220/88 A |
| 2,515,950 | 7/1950 | Dingman | 98/1 |
| 2,691,464 | 10/1954 | Lisciani | 220/88 A |
| 2,789,238 | 4/1957 | Staak | 310/88 |
| 2,801,768 | 8/1957 | Immel | 220/88 A |
| 2,985,337 | 5/1961 | Kleinpeter | 220/88 A |
| 3,394,843 | 7/1968 | Grady, Jr. et al. | 220/88 A |
| 3,711,259 | 1/1973 | Gurney | 220/88 A |
| 3,903,646 | 9/1975 | Norton | 310/88 |
| 4,149,649 | 4/1979 | Szego | 220/88 A X |
| 4,180,177 | 12/1979 | Gunderman et al. | 220/88 A |

FOREIGN PATENT DOCUMENTS

| | | | |
|---|---|---|---|
| 132793 | 11/1932 | Austria | 220/88 A |
| 120192 | 11/1947 | Sweden | 55/444 |

Primary Examiner—Harold Joyce
Attorney, Agent, or Firm—McCaleb, Lucas & Brugman

[57] ABSTRACT

A flame arresting ventilated wall or panel for an explosion-proof enclosure comprises a stack of aluminum sheets apertured to provide a plurality of discrete, generally parallel gas flow channels disposed in crisscross patterns across the heights and widths of the sheets. Fasteners tie the sheets together into a rigid structure and are disposed in patterns surrounding and individually uniformly supporting the gas flow channels from the center of the sheets to their outer edge. Combinations of three different punched sheets are used, namely, first and second apertured sheets spaced apart by relatively thin separator sheets. Along each of the plurality of gas flow channels, each separator sheet has a large window and the first and second apertured sheets have separate arrays of nine and sixteen flow holes, respectively, registered with the windows, each array having a total cross-sectional area about one-fourth of each corresponding window.

8 Claims, 10 Drawing Figures

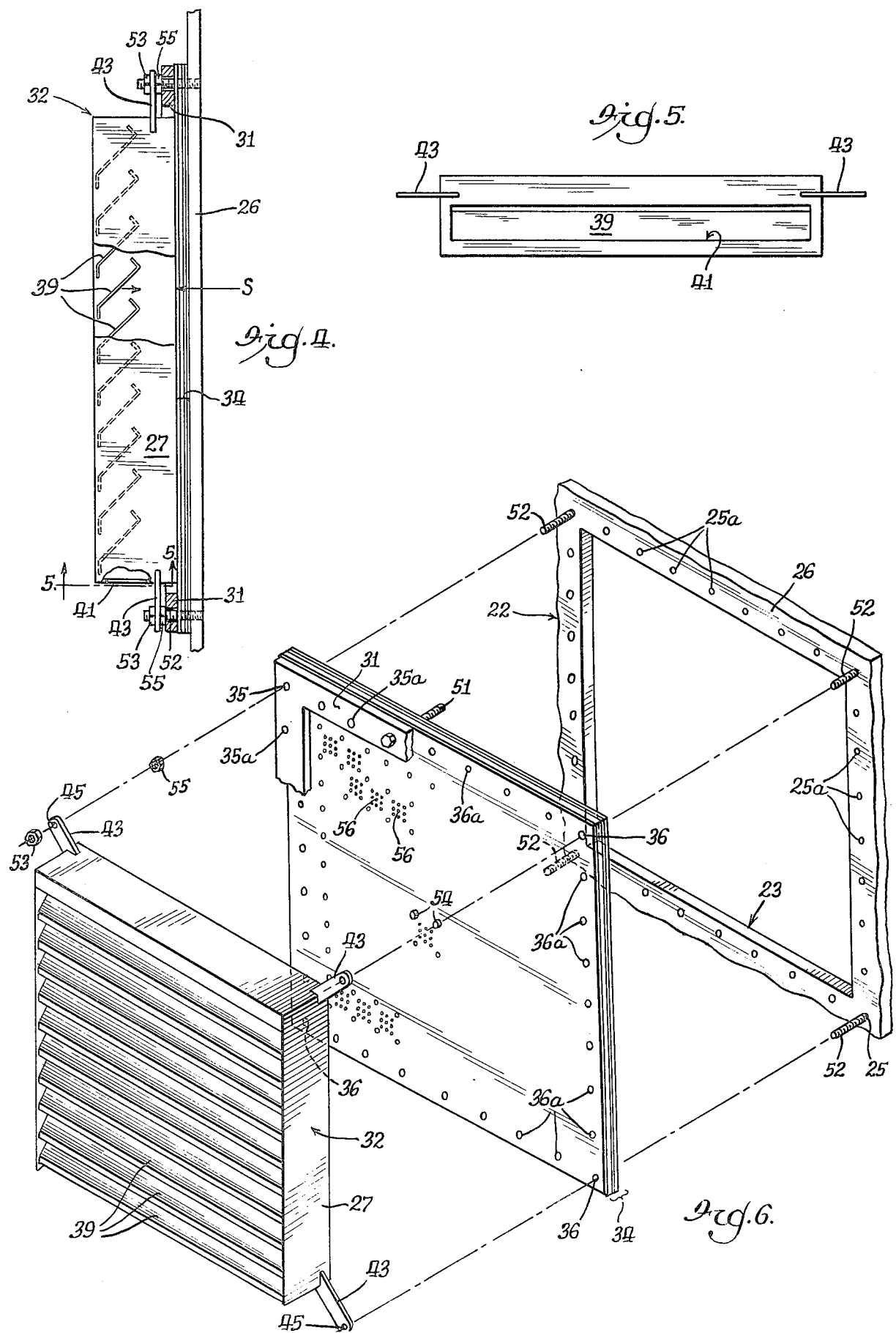

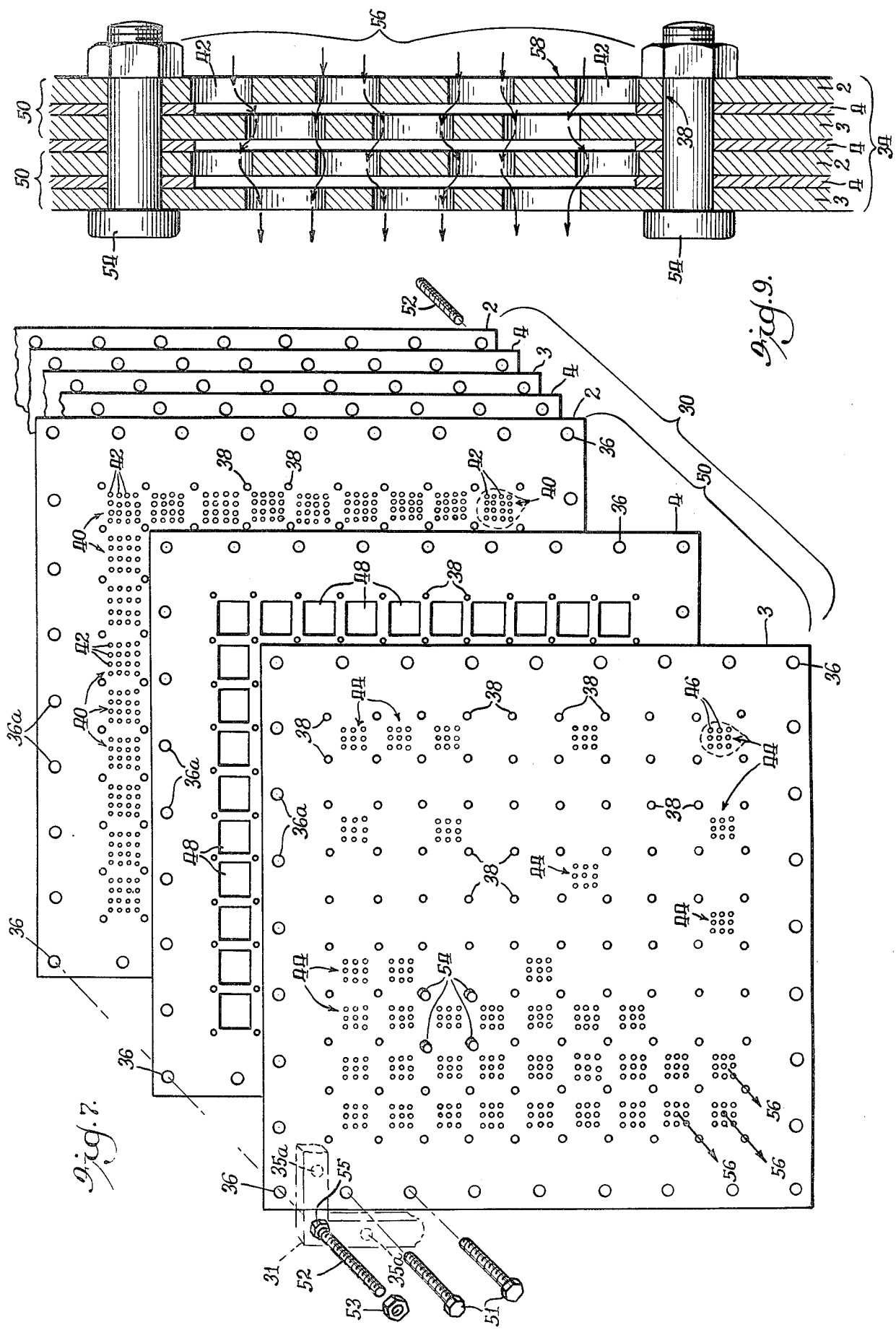

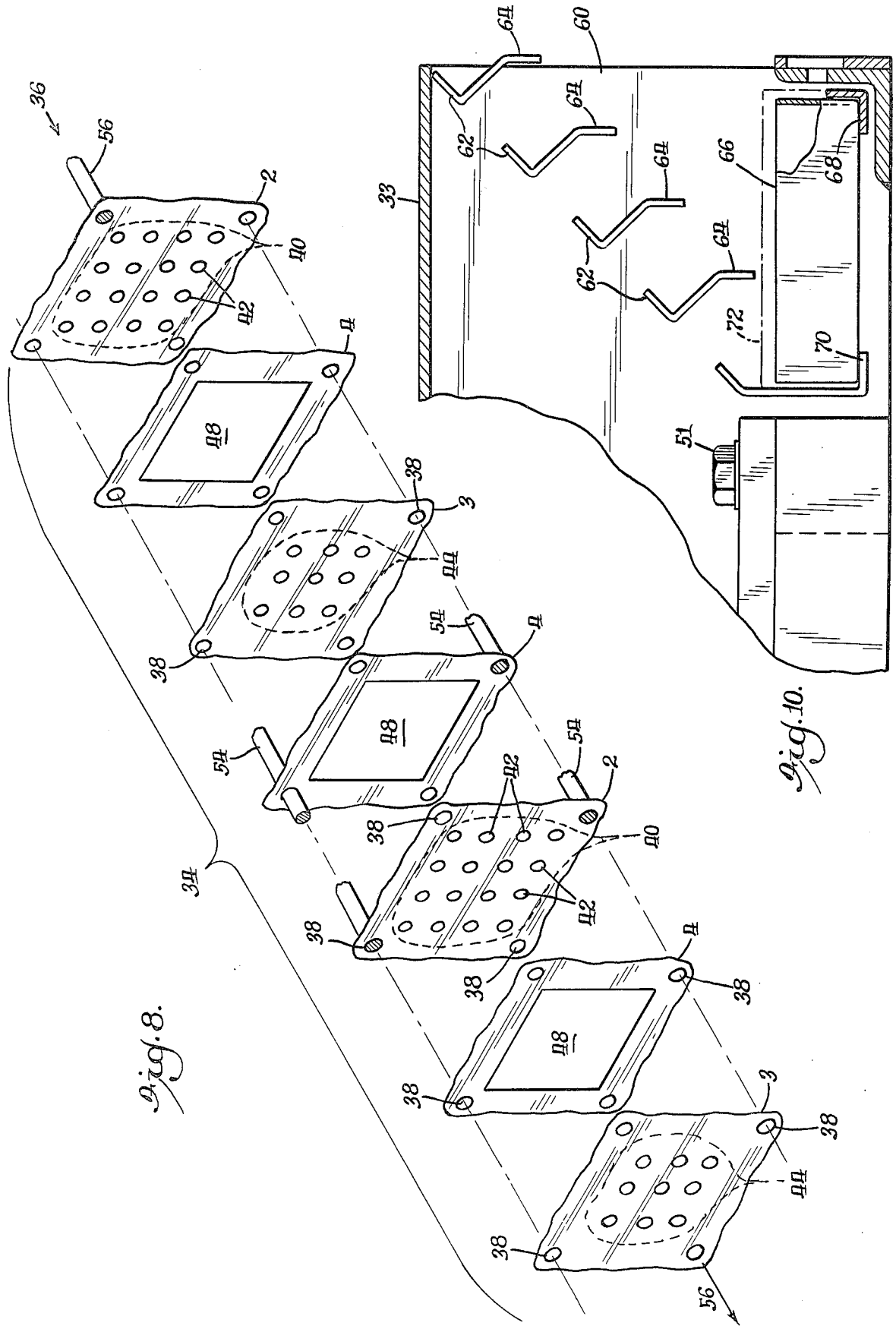

FLAME ARRESTING VENTILATED WALL FOR AN EXPLOSION-PROOF ENCLOSURE

BACKGROUND OF THE INVENTION

The invention belongs generally to the field of flame-proof walls, barriers and fittings for use on or with explosion-proof enclosures. The invention can be applied to any large wall or cover through which hot, exploding gases can move with very little back pressure but which will effectively block the passage of flame. In particular, it is concerned with a flame-proof wall or cover to make electrical equipment safe in potentially explosive atmospheres such as in underground coal mines. It is especially useful on very large structures such as heavy duty transformers which could advantageously be located near a mine face.

Underground coal mining machinery is powered by many different kinds and sizes of direct and alternating current electrical motors. To supply the power conversion and control equipment for these motors, mines must have a wide variety of electrical apparatus including transformers, power centers, rectifiers, battery chargers, motor controllers, contactors and switches. These generate heat, sparks and arcing and can ignite and explode methane-air mixtures which are often present. Accordingly, all such underground electrical equipment, installed in bye of the last open cross cut, must, by law, be housed in explosion-proof enclosures.

Theoretical considerations indicate that the temperature rise produced by the explosion of a stoichiometric mixture of methane and air contained at atmospheric pressure in a sealed enclosure will result in a pressure increase of approximately 150 pounds per square inch. Further, the disposition of equipment within the enclosure can bring about dynamic effects during the course of an explosion (known as "pressure piling") which result in peak explosion pressures significantly greater than 150 p.s.i.

It will thus be evident that the enclosures for explosion-proof electrical equipment have to be of much heavier construction than those commonly used for general industrial applications. Moreover, because pressure is force per unit area the total force on, for example, the cover of an explosion-proof enclosure, is related to the square of its linear dimensions. Thus the design and manufacture of large explosion-proof enclosures becomes increasingly difficult and expensive.

Virtually all electrical components produce heat, which is in most cases undesirable. The dissipation of this heat to prevent damage to the components is important in the design of electrical equipment. The most common form of cooling is natural convection ventilation by ambient air, through louvers or similar openings in the sides of enclosures. Such simple means of cooling are not applicable to explosion-proof enclosures because in the event of an explosion within the enclosure, the flame would readily be propagated to the surrounding atmosphere which might also be an explosive mixture.

It is possible to design special ventilators or fittings for explosion-proof enclosures which permit some ventilation, or breathing, but in the event of an explosion within the enclosure would prevent flame from being transmitted to the outside. Such devices, sometimes known as flame arresters or breathers, have been known for over 160 years, the basic principle being that employed in the original miners' safety lamp credited to Humphrey Davy where a cylindrical brass screen surrounding a flame cooled the escaping combustion gases down to a temperature insufficient to ignite explosive gases outside the screen.

The provision of an adequate ventilator can substantially reduce the maximum explosion pressure to which an enclosure is subjected and thus the enclosure can be constructed without the need for massive steel sections capable of withstanding high explosion forces and with consequent savings in labor and material costs. Furthermore, the reduced weight of such an enclosure is a continuing advantage where the electrical equipment must be moved from time to time as the mining work progresses.

The great majority of explosion-proof enclosures in current use have no means of direct ventilation. Heat dissipation from heat-generating circuit components within the enclosure is by internal air convection which transmits the heat to the cooler walls of the enclosure. The metallic walls conduct the heat through to their outside surfaces where cooling by external ambient air convection takes place. Hence, it will be apparent that in the case of explosion-proof enclosures there are two additional gas-to-solid and solid-to-gas heat transfer processes involved in the heat dissipation path, each of which requires a substantial temperature gradient to be effective.

This indirect transfer of heat from the inside to the outside of explosion-proof enclosures requires substantially higher driving temperatures than in freely ventilated enclosures. It is well established that the service life of most commonly used electrical insulating materials is inversely proportional to the operating temperature, and it is therefore desirable to reduce the temperature whenever expedient.

Attempts to ventilate the interior space of explosion-proof enclosures by passing relatively cooler ambient air through them have been effective on some electrical motors where it has been possible to modify the rotor to act as a fan to draw outside air in through one flame arrester and discharge it through another. This is illustrated for example in U.S. Pat. No. 2,789,238 issued to J. H. Staak. However, in explosion-proof enclosures such as those for transformers, power centers, rectifiers, battery chargers, and the like, which do not already have internal motors capable of being used as fans, or in which the additional complication of a separate motorized fan would be objectionable, the heat build-up resulting from the lack of ventilation has been tolerated as the least objectionable of undesirable choices.

Prior to the present invention, large area walls capable of providing ventilation and being effective as a flame-proof barrier have not been available. As a result, large enclosures such as power transformers used in underground coal mines have not been made explosion-proof. For this reason, they have been located a long distance from the potentially gassy coal face area where most of the electrical power is used to mine the coal. This results in increased voltage drop, reduced motor starting torques, and lower efficiencies. It also requires a long length of large diameter, low-voltage cable, which is costly and hard to handle, between the transformer and the machinery at the mine face.

Flame arresting ventilators and breather pipe fittings of relatively small sizes have been used widely in underground electric motors, venting and drain devices for petroleum and explosive chemical tanks, for exhausts of engines operating in potentially explosive atmospheres, and many other applications involving explosive gases. These are in four general types as follows:

I. Closely-spaced flat or coiled metal strips or plates, which allow the free passage of gases, but in case the gases are ignited, they will be cooled below the ignition temperature by the time they pass through to the other side. Examples are shown in the following U.S. patents: Long et al U.S. Pat. No. 2,068,421; Anschicks U.S. Pat. No. 2,151,180; Edwards U.S. Pat. No. 2,247,225; Duggan U.S. Pat. No. 2,388,395; Lisciani U.S. Pat. No. 2,691,464; Staak U.S. Pat. No. 2,789,238; Norton U.S. Pat. No. 3,903,646; and Szego U.S. Pat. No. 4,149,649.

II. Heat conducting open porous metal flame-proof barriers. Examples are shown in the following U.S. patents: Immel U.S. Pat. No. 2,801,768; Kleinpeter U.S. Pat. No. 2,985,337; Grady, Jr. et al U.S. Pat. No. 3,394,843; Gurney U.S. Pat. No. 3,711,259; and Gunderman et al U.S. Pat. No. 4,180,177.

III. Flame-proof cylindrical screens similar to that used on the original Davy-type mine lamp. Examples are shown in the following U.S. patents: Jett U.S. Pat. No. 2,220,720; and Dingman U.S. Pat. No. 2,515,950.

IV. Apertured or truncated disks or plates which are clamped together around their outer peripheries and supported at right angles to the general direction of fluid flow. The successive disks or plates have offset openings forcing gases to follow a tortuous path from one to the next. This type is commonly in use, but its air flow capacity is limited because the disks or plates are completely unsupported inside their clamped outer edges. If made in large sizes as contemplated by the present invention, they would distort and allow the passage of flame to the outside in case of an internal explosion. Examples are shown in the following U.S. patents: Wyman U.S. Pat. No. 1,960,259; and Spaeth U.S. Pat. No. 2,610,684.

All the conventional ventilating flame-proof devices described above are relatively small, in the nature of pipe fittings or the like. None discloses a large wall section which is capable of passing substantial volumes of air or gases at low back pressure while acting as a flame arresting barrier to fill the need for large explosion-proof enclosures such as for power transformers used in mines.

SUMMARY OF THE INVENTION

It is a general object of the present invention to provide a flame arresting ventilated wall for an explosion-proof enclosure which can be fabricated in very large sizes and used as a sidewall or cover for a large structure such as a power transformer used in underground coal mines.

Another object of the invention is to provide such a flame arresting ventilated wall which offers a sufficiently low resistance to air flow that a substantial amount of direct convection cooling can take place and thereby effectively reduce the operating temperatures of electrical components within the enclosure, this being particularly relevant to mining power transformers and the like which generate substantial amounts of heat.

Another object of the invention is to provide a flame arresting ventilated wall which offers such a low resistance to air or gas flow that the pressure rise inside the enclosure is insignificant even if an internal explosion occurs, thereby minimizing the strength and weight required for the walls and covers of the enclosure.

An important feature of the invention is the provision of a flame arresting ventilated wall comprising a stack of perforated metal sheets individually apertured to provide a plurality of separate, independent, discrete, generally parallel gas flow channels extending through the stack to break up and divide the gases into separate streams, break up and subdivide each stream into a plurality of smaller substreams while directing them in labyrinthine paths through varying cross-section openings which alternately expand, contract, speed up, slow down, and scrub the hot gases against the relatively cold metal surfaces to effectively quench them.

Another object of the invention is to provide an explosion-proof enclosure having a ventilated panel comprising a stack of apertured plates in the top wall thereof and providing an outlet for air moving upward by convection within the enclosure, a cover member over the ventilated panel, an opening in one side of the cover member having louvers therein, and a removable tray beneath the louvers to collect air-borne dust.

BRIEF DESCRIPTION OF THE DRAWINGS

Other objects and advantages will be apparent from the following description taken in connection with the accompanying drawings in which:

FIG. 4 is a fragmentary elevational view of FIG. 3 with portions cut away and other portions omitted for clarity, as seen in the direction of the arrows 4—4;

FIG. 5 is a fragmentary bottom view of FIG. 4 taken in the direction of the arrows 5—5;

FIG. 6 is an exploded, fragmentary perspective view of FIG. 4 showing details of the flame-arresting ventilated wall and an overlying louver;

FIG. 7 is an exploded perspective view of the flame-arresting ventilated wall shown assembled in some of the previous figures;

FIG. 8 is a fragmentary enlarged view of FIG. 7 showing one of a plurality of discrete, generally parallel gas flow channels through the flame-arresting ventilated wall;

FIG. 9 is a fragmentary enlarged assembled cross-sectional view of the elements defining the gas flow channel shown in FIG. 8; and FIG. 10 is a vertical cross-sectional view of FIG. 3 taken along the line 10—10.

Like parts are referred to by like reference characters throughout the drawings.

DESCRIPTION OF THE PREFERRED EMBODIMENT

Figure 1:
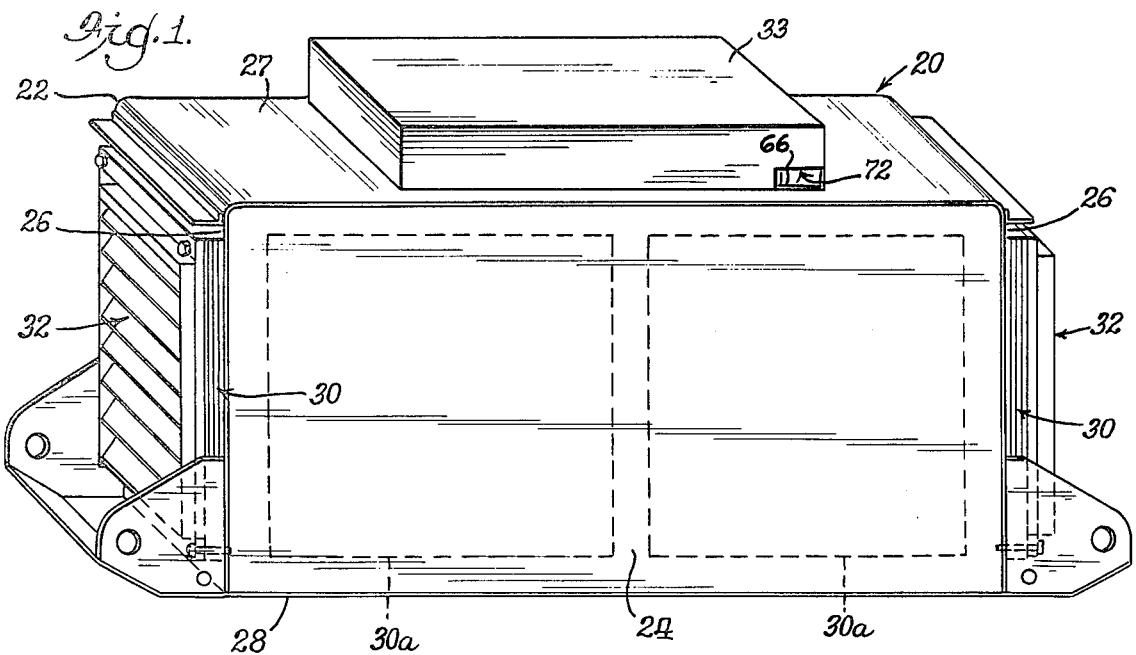
FIG. 1 is a perspective view of a portable, electric transformer or power station employing the present invention.
Figure 2:
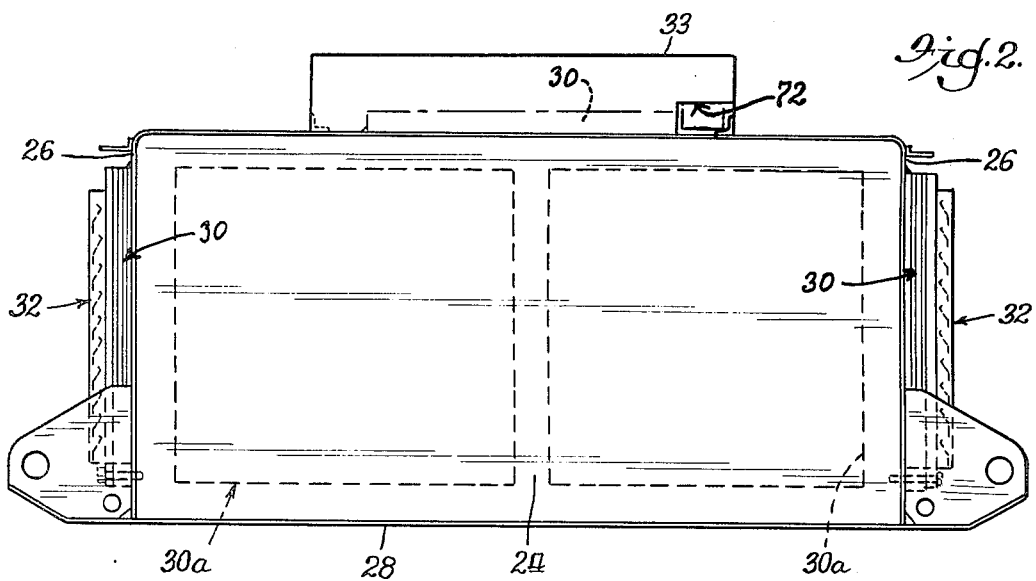
FIG. 2 is a front elevational view of FIG. 1.
Figure 3:
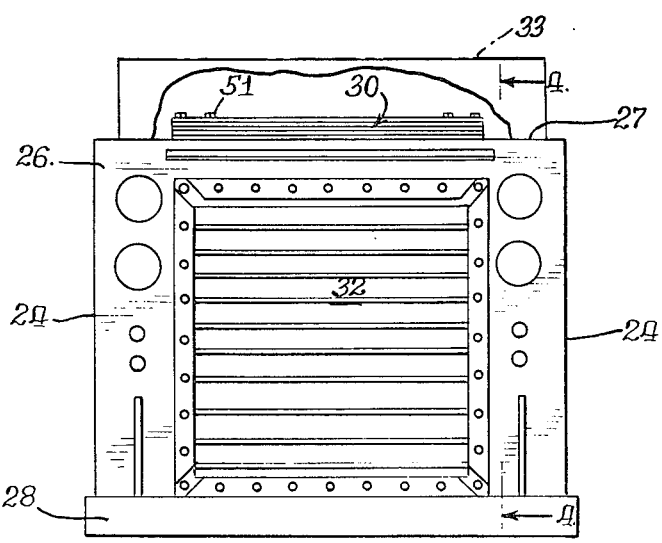
FIG. 3 is a left-end elevation of FIG. 1.

Referring now to the specific embodiment of the invention in the drawings, FIG. 1 shows a portable power transformer or power station 20 comprising an enclosure 22 with opposite front and back sides 24, opposite ends 26, and a top 27 mounted on ground-engaging skids 28.

In the embodiment illustrated, three flame arresting ventilated walls or panels each generally designated 30, are provided. These are located on the opposite ends 26 and the top 27. In addition, a louvered, dust-deflecting cover member 32 is provided at each end and a dust-deflecting top cap 33 is provided at the top. Optionally, as shown in broken lines in FIG. 1, a pair of ventilated walls 30a similar to walls 30 may be provided on each side 24.

As best shown in FIGS. 7-9, each wall 30 comprises a stack 34 of metal sheets which resist corrosion and distortions. One example is aluminum which has good heat conductivity and is easy to perforate by punching. The stack comprises multiples of three basic perforated sheets, namely two apertured sheets 2 and 3 and a separator sheet 4. These are in multiple combinations which will be described in detail. The relatively large numbers of holes in precise, regular patterns are readily punched out of thin sheet aluminum by means of well known computer controlled automatic punching machines.

Each apertured sheet 2 is punched with a plurality (thirty-two) of peripheral bolt holes 36 and 36a, a plurality (one hundred and twenty-one) of fastener holes 38, and a plurality (one hundred) of arrays 40 of holes 42. In the example shown, each array consists of a square pattern of sixteen 9/32 inch diameter holes totaling approximately one square inch per array.

Apertured sheets 3 are identical to apertured sheets 2 in every way except that they have different hole arrays. Each sheet 3 has one hundred hole arrays 44, each consisting of a square pattern of nine ⅜ inch diameter holes 46 which also total approximately one square inch per array.

Separator sheets 4 are identical to apertured sheets 2 and 3 except that they have one hundred windows 48 instead of one hundred hole arrays 40 and 44. Each window is two inches square, totaling four square inches in area, thereby being substantially four times the total cross-sectional area of the holes in either array 40 or 44. This 4:1 ratio enables alternate expansion and contraction, and simultaneous change in velocity of the gases flowing through them as will be described.

The stack 34 comprises alternate apertured and separator sheets. In the example shown, the stack includes seven sheets sequenced in the following order: 2-4-3-4-2-4-3. Thus, it comprises a plurality, in this case two, of groups 50 of sheets 2-4-3. A separator sheet 4 is interposed between adjacent groups.

In the embodiment illustrated, each end 26 of the enclosure and the top 27 has a large, square opening 23 with thirty-two screw-tapped holes about the periphery. This is shown in FIG. 6 for the left hand end wall 26. The corner holes 25 have relatively long studs 52 threadedly seated in them and the seven peripheral holes 25a between the corner holes on each side of the opening are threadedly engageable with peripheral cap screws 51. To assemble one of the stacks 34 over one of the openings 23, the corner holes 36 in the stack are fitted over the four corner studs 52 extending from the enclosure. A rectangular escutcheon 31 with corner holes 35 and seven intermediate holes 35a on each side may be provided to reinforce the outer periphery of the stack. The stack is assembled by tightening corner nuts 55 on corner studs 52 against the escutcheon and by inserting cap screws 51 through the holes 35a and 36a and tightening them into the respective tapped holes 25a in the enclosure 22. At this stage, the four corner studs 52 extend through the corner holes 35 in the escutcheon, ready for attaching the louvered cover member 32. Alternatively, the escutcheon 31 may be omitted or provided as an optional extra component.

The louvered cover member 32 comprises a square frame 27 with a plurality of horizontally extending diagonal louvers or slats 39. The bottom wall of the frame has an elongated opening 41 which serves the dual purpose of preventing accumulation of dust in the lower part of the frame, and provides an entry for cool, ambient air at the very bottom of the frame. Four short, diagonal, flat straps are affixed as by welding at the four corners of the louver frame. Each has a hole 45. The louvered cover member 32 is assembled over the stack 34 by fitting the strap holes 45 over the corner studs 52 against nuts 55 and tightening nuts 53. As shown in FIG. 4, the louvers 39 are spaced outwardly a distance S from the stack 34. This improves the effectiveness of the stack as a flame extinguisher.

The dust deflecting top cap 33 is provided at the top, instead of a louvered cover 32. The cap 33 comprises a top wall 47, three sidewalls 48 and an open side 49 through which convection air exits.

An important feature of the invention which binds the stack of sheets together into a rigid whole is that, in addition to corner stud bolts 52 which extend through corner bolt holes 36 in the stack, one hundred and twenty-one tie bolt fasteners 54 extend through fastener holes 38 in crisscross patterns across the heights and widths of the sheets. These tie the otherwise flexible, thin aluminum sheets into a rigid structure capable of being made in very large sizes, in fact several feet across for large enclosures, yet will positively withstand deformation and prevent the emission of flame if an explosion occurs within the enclosure 22.

Thus, the tie bolt fasteners 54 are disposed in patterns of four surrounding and individually supporting one hundred separate, discrete gas flow channels 56. The groups of four tie bolt fasteners 54 compress the sheets tightly against one another and separate the channels from one another.

One of the channels 56 is shown in enlarged detail in both FIGS. 8 and 9. Tracing one of the channels 56 from the inside of the enclosure to the outside (from right to left in FIGS. 8 and 9), each comprises a sixteen-hole array 40; a window 48; a nine-hole array 44; a window 48; a sixteen-hole array 40; a window 48; and a nine-hole array 44.

The arrays 40, 44 and windows 48 are held positively in registration by cap screws 51, corner studs 52 and tie bolt fasteners 54. The nine- and sixteen-hole patterns are non-coincident, so gas flowing from a sixteen-hole array to a nine-hole array or vice versa, is directed laterally, in random labyrinthine or serpentine paths.

As gas flows from one of the arrays 40 or 44, each having a total hole area of one square inch into a window 48 having an area of four square inches, the gas will expand and increase velocity momentarily. Conversely, when gas flows from a window 48 into one or the other of the hole arrays, it will be compressed and decrease velocity momentarily. This is very beneficial in creating a scrubbing action of the gases against the metal plates, reducing the thicknesses of any localized, stagnant, insulating gas films on those surfaces to thereby enhance heat transfer into the metal.

The flame arresting ventilated wall 30 thereby has the following three structural features which make it readily adaptable to very large structures, and which effectively snuff out and quench the flaming gases well below their ignition temperature so they cannot cause an explosion when discharged into an explosive air/methane mixture outside;

*In the first place,* if an explosion occurs within the enclosure 22, the hot flaming gases impinging against the inner surface 58 of the inner sheet 2 will be broken up and divided into one hundred separate channels 56 through which it will flow in one hundred separate parallel streams.

*In the second place,* each stream will be broken up and subdivided into substreams and diverted sidewise randomly into serpentine or labyrinthine paths each time it passes through one of the nine-hole or sixteen-hole arrays 40 or 44.

*In the third place,* the volumes of the substreams are expanded and contracted, and their velocities are rapidly increased and decreased several times in flowing between the relatively small cross-section hole arrays and the much larger cross-section windows.

As a result of the confluence of all these design factors, in the event of a methane-air explosion within the enclosure 22, the present invention is capable of rendering gases from the most violent gas explosion perfectly safe to the surrounding atmosphere, even when the atmosphere itself is explosive.

The most violently explosive methane-air mixture is one having stoichiometric proportions. Actual explosion tests with such mixtures produced artificially in an enclosure fitted with a flame-proof wall according to the present invention verify its ability to prevent the escape of flame while limiting pressure rise to an insignificant value within the enclosure. By tying the stack 34 together over its entire width and height by means of tie bolt fasteners 54 there is produced a rigid wall structure which will not destructively distort, even in very large area walls, and the enclosure can be made sufficiently light in weight to be readily transportable.

Transformer enclosures fitted with stacks 34, as described, run appreciably cooler than conventional enclosures which are completely sealed. One test simulating internal heat generation with a 1500 watt generator showed sufficient natural convection cooling through the stacks to reduce the temperatures appreciably in eight different internal locations. Maximum temperature rise above the ambient was on the surface of the heaters. This was 204° C. for the sealed enclosure and only 184° C. for the same enclosure fitted with the present invention.

As best shown in FIG. 10, the top cover 33 is open at one end 60 to provide a convection outlet for air which enters the ventilated end walls 30 and rise within the enclosure 22. A series of metal louvers 62, each with a depending, vertical fin 64, is positioned within the opening, over a tray 66 which is supported on rails 68 and 70 and which is removable through an opening 72 (FIG. 1) in the cover. The louvers 62 prevent the holes 42 and 46 from becoming blocked by rock dust and air-borne coal dust. Mobile rock-dusting machines are used in underground coal mines to spread rock dust in roadways and working areas to dilute and render harmless concentrations of otherwise explosive coal dust. A careless operation of such a machine could block the holes 42 and 46 with rock dust if it were not deflected by the louvers in cover members 32 and top cap 33. The rock and coal dust is deflected downwardly into the tray 66 by the vertical fins 64. When the tray is filled, it may be removed through opening 72 and emptied.

It is important that the ventilated walls be cleaned periodically to remove any accumulations of dust, even though dust accumulates slowly because of the louvered cover member 32 and the dust-deflecting top cap 33. This can be done by first removing the nuts 53 from the four corner studs and lifting the louvered cover member 32 out of the way to expose the cap screws 51. If the louvered cover member 32 only requires cleaning, it can be cleaned and reassembled with the four corner units 53. By unscrewing the corner nuts 55 and cap screws 51, the entire stack 34 can be removed as a unit if it requires cleaning. At this point it is a simple bench operation to remove the tie bolt fasteners 54 and thoroughly clean each individual plate. Alternatively, special cleaning equipment such as an ultrasonic washer can be used without separating the plates. If the individual sheets are riveted, the use of ultrasonic cleaning equipment would be preferable to removing the rivets.

The embodiment described to illustrate the present invention has been necessarily specific for purposes of illustration. Alterations, extensions, modifications, and variations of the specific dimensions described would be apparent to those skilled in the art.

The embodiments of the invention in which an exclusive property or privilege is claimed are defined as follows:

1. A flame arresting ventilated wall for an explosion-proof enclosure comprising:
    a stack of metal sheets apertured to provide a plurality of discrete, generally parallel gas flow channels extending therethrough and disposed in crisscross patterns across the heights and widths of the sheets;
    said stack comprising alternate apertured and separator sheets;
    fasteners disposed in crisscross patterns across the heights and widths of the sheets individually supporting and sealing said discrete gas flow channels, said fasteners extending through aligned holes in said apertured and separator sheets and effective to compress the stack into a plurality of solid columns adjacent the fasteners tying the stack together into a rigid structure resistant to deformation by explosion of gases on one side thereof while positively maintaining a predetermined spacing between adjacent apertured sheets throughout the stack;
    each of said apertured sheets having, in each said gas flow channel, an array of individual openings having a predetermined total area, the individual openings in successive apertured sheets being offset from one another in directions parallel to the sheets to train gas flow therethrough into labyrinthine paths;
    each of said separator sheets having, in each said gas flow channel, a window opening substantially larger than said predetermined total area and in registration with said arrays of individual openings in said apertured sheets;
    whereby quenching of hot gases flowing through said wall is effected by, first, dividing the gases into separate streams through said gas flow channels, second, further breaking up and subdividing each stream and directing it in labyrinthine paths as it passes through the individual openings in the apertured sheets, and third, alternately expanding and contracting and speeding up and slowing down said gases in said flow channels as they alternately pass between the arrays of individual openings in the apertured sheets and the substantially larger area window openings in the separator sheets.

2. A flame arresting ventilated wall for an explosion-proof enclosure according to claim 1 in which said predetermined total area of each said array of individual openings is substantially the same for each of said apertured sheets.

3. A flame arresting ventilated wall for an explosion-proof enclosure according to claim 1 in which said arrays in alternate apertured sheets comprise alternate square patterns of nine individual holes and sixteen individual holes.

4. A flame arresting ventilated wall for an explosion-proof enclosure according to claim 1 in which the area of said window openings in the separator sheets are at least four times said predetermined total area of the array of individual openings in any adjacent apertured sheet.

5. A flame arresting ventilated wall for an explosion-proof enclosure according to claim 1 in which said stack of metal sheets comprise a plurality of groups of sheets, each group including a first apertured sheet, a second apertured sheet and a separator sheet between the apertured sheets, one of said separator sheets also being disposed between adjacent ones of said groups, the arrays of individual openings in said first apertured sheets being identical, and the arrays of individual openings in said second apertured sheets being identical to one another but different from said arrays in said first apertured sheets.

6. A flame arresting ventilated wall for an explosion-proof enclosure according to claim 1 in which said apertured sheets are 0.10" thick, said separator sheets are 0.05" thick, said window openings in said separator sheets are approximately 2" square, said array of individual openings in said first apertured sheets comprise nine $\frac{3}{8}$" diameter holes, and said array of individual openings in said second apertured sheets comprise sixteen 9/32" diameter holes, both said arrays having a square pattern with outside dimensions approximating those of said window openings.

7. A flame arresting ventilated wall for an explosion-proof enclosure according to claim 1 in which a louvered cover member is fastened to the enclosure and has a plurality of horizontally extending louvers which are spaced substantially outwardly from the outer surface of said stack to enhance the effectiveness of the stack as a flame extinguisher.

8. A flame arresting ventilated wall for an explosion-proof enclosure according to claim 7 in which said ventilated wall is fastened over an opening in a vertical sidewall of said enclosure, said louvered cover member comprises a plurality of horizontally disposed diagonal slats mounted within a frame extending about the periphery of said stack, and the bottom of said frame has an opening directly beneath the space between the stack and louvers serving the dual purpose of preventing the accumulation of dust in said space in the frame and providing an inlet for convection air to enter the enclosure through the extreme bottom of said stack.

* * * * *